United States Patent
El-Khamy et al.

(10) Patent No.: US 9,742,440 B2
(45) Date of Patent: Aug. 22, 2017

(54) HARQ RATE-COMPATIBLE POLAR CODES FOR WIRELESS CHANNELS

(71) Applicant: Samsung Electronics Co., Ltd., Gyeonggi-do (KR)

(72) Inventors: Mostafa El-Khamy, San Diego, CA (US); Jungwon Lee, San Diego, CA (US); Inyup Kang, San Diego, CA (US); Hsien-Ping Lin, Davis, CA (US)

(73) Assignee: Samsung Electronics Co., Ltd (KR)

( * ) Notice: Subject to any disclaimer, the term of this patent is extended or adjusted under 35 U.S.C. 154(b) by 43 days.

(21) Appl. No.: 14/836,280

(22) Filed: Aug. 26, 2015

(65) Prior Publication Data
US 2016/0285479 A1 Sep. 29, 2016

Related U.S. Application Data

(60) Provisional application No. 62/138,050, filed on Mar. 25, 2015.

(51) Int. Cl.
*H04L 1/18* (2006.01)
*H03M 13/00* (2006.01)
(Continued)

(52) U.S. Cl.
CPC ..... *H03M 13/6368* (2013.01); *H03M 13/005* (2013.01); *H03M 13/13* (2013.01);
(Continued)

(58) Field of Classification Search
CPC ........... H03M 13/6368; H03M 13/005; H03M 13/616; H04L 1/1896
See application file for complete search history.

(56) References Cited

U.S. PATENT DOCUMENTS 7,099,405 B2 * 8/2006 Xu .................. H04L 1/0068
375/316
8,250,429 B2 * 8/2012 Lin ................. H03M 13/2957
714/755
(Continued)

FOREIGN PATENT DOCUMENTS

CN 103281166 9/2013
CN 103414540 11/2013
(Continued)

OTHER PUBLICATIONS

Kai Chen et al., A Hybrid ARQ Scheme Based on Polar Codes, Communications Letters, IEEE (vol. 17 , Issue: 10 ).
(Continued)

*Primary Examiner* — Esaw Abraham
(74) *Attorney, Agent, or Firm* — The Farrell Law Firm, P.C.

(57) ABSTRACT

A method, apparatus, and chipset are provided for constructing hybrid automatic repeat request (HARQ) rate-compatible polar codes for communication channels. The method includes constructing, in a terminal, a base polar code of length $2^n$; and determining a sequence of $m<2^n$ bits to puncture in the base polar code by testing a predetermined criterion at most $(2^{2n}+2^n)/2-1$ times.

20 Claims, 7 Drawing Sheets

(51) Int. Cl.
*H03M 13/13* (2006.01)
*H04L 1/00* (2006.01)

(52) U.S. Cl.
CPC ........ *H03M 13/616* (2013.01); *H04L 1/0057* (2013.01); *H04L 1/0068* (2013.01); *H04L 1/1816* (2013.01); *H04L 1/1819* (2013.01)

(56) References Cited

U.S. PATENT DOCUMENTS

| | | | | |
|---|---|---|---|---|
| 8,416,862 | B2* | 4/2013 | Aldana | H04B 7/0617 |
| | | | | 375/260 |
| 8,516,334 | B2* | 8/2013 | Xu | H03M 13/116 |
| | | | | 714/758 |
| 9,007,241 | B2* | 4/2015 | Alhussien | H03M 13/618 |
| | | | | 341/67 |
| 9,239,778 | B2* | 1/2016 | Lee | H03M 13/1111 |
| 9,304,859 | B2* | 4/2016 | Aliev | G06F 11/108 |
| 2013/0343271 | A1 | 12/2013 | El-Khamy | |
| 2014/0169388 | A1 | 6/2014 | Jeong et al. | |
| 2014/0169492 | A1 | 6/2014 | Mahdavifar et al. | |

FOREIGN PATENT DOCUMENTS

| | | |
|---|---|---|
| CN | 104038234 | 9/2014 |
| WO | WO 2014116301 | 7/2014 |

OTHER PUBLICATIONS

Kai Chen et al., Polar Codes HARQ Scheme with Chase Combining, http://arxiv.org/pdf/1310.6650.pdf.

* cited by examiner

HARQ RATE-COMPATIBLE POLAR CODES FOR WIRELESS CHANNELS

PRIORITY

This application claims priority under 35 U.S.C. §119(e) to a U.S. Provisional Patent Application filed on Mar. 25, 2015 in the United States Patent and Trademark Office and assigned Ser. No. 62/138,050, the entire contents of which are incorporated herein by reference.

BACKGROUND OF THE DISCLOSURE

Field of the Disclosure

The present disclosure relates generally to constructing rate-compatible polar codes, and more particularly, to constructing hybrid automatic repeat request (HARQ) rate-compatible polar codes for wireless channels.

Description of the Related Art

Polar codes are the first and currently only family of codes with explicit construction (i.e., no ensemble to pick from) and low-complexity encoding and decoding algorithms that achieve the capacity over a certain class of channels. A polar transformation is defined as a multiplication of an input vector by a polarization matrix $$F_2^{\otimes n} = \begin{bmatrix} 1 & 0 \\ 1 & 1 \end{bmatrix}^{\otimes n}.$$

Polar code construction, or channel polarization, is based on the observation that as a length $N=2^n$ of a polar transformation increases, the observed bit-channels at the input are polarized so that they become either noiseless (perfect) channels or completely noisy channels. A polar code is constructed by transmitting information bits over the noiseless channels, also referred to as good bit-channels, while restricting (or freezing) the input to the noisy channels, also referred to as bad bit-channels, to zeros.

Constructing polar codes (i.e., finding good bit-channels) is, in general, a hard problem. There are some heuristic and approximate algorithms that attempt to solve the problem. However, they only concern one given channel and do not disclose a method of constructing a polar code that is universally good for an arbitrary class of channels.

Another complicating factor is that the construction of polar codes, in general, depends on the characteristics of the underlying channel. As a result, if a polar code is optimized for transmission across a certain channel, it may not be good for transmission over another channel. This is a challenge in constructing polar codes suitable for practical applications, because in a communications system, an underlying channel varies. Thus, there is a need for an apparatus and method of constructing a polar code that is robust to channel variations.

Wireless systems also suffer from uncertainties in channel estimation and delayed feedback. To achieve better overall system throughput, a hybrid automatic repeat request (HARQ) protocol is often deployed. In a HARQ system, data may be encoded with an error detection code, such as cyclic redundancy check code, for error detection control. The data may also be encoded with an error correction code, such as a polar code, to improve the error rate performance.

Upon receipt of a transmission, the error detection control mechanism is checked. If the error detection control mechanism indicates that a transmission was received successfully, then an acknowledgement message (ACK) is generated, and no further transmissions are required. If the error detection mechanism indicates that a transmission was not received successfully, then a non-acknowledgement message (NACK) is generated, and a retransmission is requested from the transmitter node. Retransmissions can be the exact same data bits as the previous transmission (commonly referred to as Chase combining), or can include new redundancy bits, commonly referred to as incremental redundancy (IR), which when combined with data of the previous transmission form another codeword having a lower rate, where a rate of a code (k/N) is a ratio of information bits (k) in a code to the total number of bits (N) in the code. In hybrid Chase/IR transmissions, retransmissions can include some of the previously transmitted bits as well as some new redundancy bits.

There is a need for a rate-compatible family of codes that are suitable for HARQ transmissions.

SUMMARY

An aspect of the present disclosure is to provide a method of and an apparatus for constructing polar codes at different rates that form a rate compatible family, which can be used for communications systems that deploy HARQ transmissions, or for memory systems such as flash memories.

Another aspect of the present disclosure is to provide a method of and an apparatus for polar coding with a rate-compatible family, where a puncturing pattern is defined on a base code of short length, and where progressive puncturing is used to assign the puncturing pattern at different code rates for the base code.

Another aspect of the present disclosure is to provide a two-step polarization with a rate-matching row-column method of and an apparatus for preserving further polarization of a base polar code to a predetermined length, resulting in a regular puncturing pattern.

Another aspect of the present disclosure is to provide a method of and an apparatus for constructing rate-compatible polar codes on channels composed of constituent channels or multi-channels as communication systems with bit-interleaved code modulations and higher order modulation.

Another aspect of the present disclosure is to provide a method of and an apparatus for polar code construction method with rate-matching and bit-selection to enable HARQ Chase combining or incremental redundancy communications.

In accordance with an aspect of the present disclosure, a method of constructing hybrid automatic repeat request (HARQ) rate-compatible polar codes for wireless channels is provided. The method includes constructing, in a terminal, a base polar code of length $2^n$; and determining a sequence of $m<2^n$ bits to puncture in the base polar code by testing a predetermined criterion at most $(2^{2n}+2^n)/2-1$ times. The method also includes constructing a longer code of length $2^{n+t}$ from the base polar code, with regular puncturing and repetition patterns derived from the puncturing sequence of the base polar code.

In accordance with another aspect of the present disclosure, an apparatus for constructing hybrid automatic repeat request (HARQ) rate-compatible polar codes for wireless channels is provided. The apparatus includes a base polar code generator including an input for receiving an integer n, and an output; and an m-bit puncture pattern generator including a first input connected to the output of the base polar code generator, a second input for receiving a design criterion, and an output.

In accordance with another aspect of the present disclosure, a chipset for constructing hybrid automatic repeat request (HARQ) rate-compatible polar codes for wireless channels is provided. The chipset is configured to construct a base polar code of length $2^n$; and determine a sequence of $m<2^n$ bits to puncture in the base polar code by testing a predetermined criterion at most $(2^{2n}+2^n)/2-1$ times. The chipset is also configured to construct a longer polar code of final length $2^{n+t}$ with regular puncturing and repetition patterns derived from the puncturing sequence of the base polar code.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
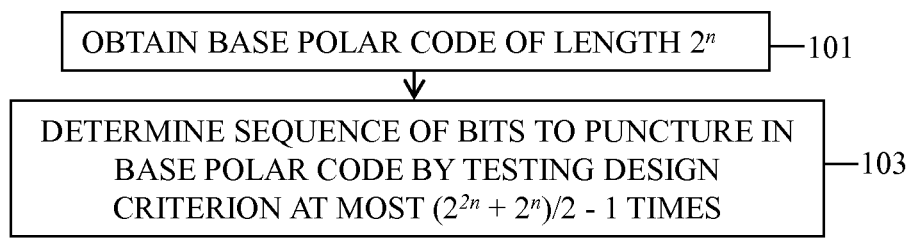
FIG. 1 is a flowchart of a method of generating a progressive puncturing pattern for a base polar code according to an embodiment of the present disclosure.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments will now be described in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein, which include technical terminologies or scientific terminologies, have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

The present disclosure concerns a method of and an apparatus for constructing a rate-compatible family of polar codes suitable for HARQ applications. A family of rate-compatible polar codes includes nested polar codes, where a polar code of a lower rate is derived from a polar code of a higher rate by appending additional bits to the polar code of the higher rate to obtain the polar code of a lower rate.

Hence, all polar codes in a rate-compatible family of polar codes have the same information set size, but different rates.

Polar codes using a 2×2 polarization matrix will have a length of $N=2^n$, whereas polar codes using q×q polarization matrices will have a length of $N=q^n$. Polar codes with different lengths are often used for transmission or memory encoding. Punctured polar codes can be constructed to operate at different rates (k/N). The present disclosure provides a method and an apparatus that do not require bit-error probability calculation at a full code-length. Whereas the embodiments described hereafter refer to the polar code length as $N=2^n$, they also apply to different polar code lengths of $N=q^n$.

The present disclosure provides a low-complexity progressive puncturing method and apparatus, which eliminates the need for an exhaustive search for each polar code rate and for each polar code length. A puncturing pattern is defined on a base polar code of short length upon which a final polar code of a longer length is generated. Hence, only a short sequence of bits is required to be stored at a transmitter and receiver instead of a longer sequence of bits for an entire final polar code and for each desired code rate. Thus, any polar code with any length or rate can be generated.

The present disclosure also provides a rate-matching and interleaving method and apparatus which preserves further polarization of a base polar code to a predetermined length, resulting in a regular puncturing pattern, which simplifies hardware implementation of the punctured polar code. The rate-matching and interleaving method allows generation of codes at any desired rate using puncturing or repetition while preserving code performance. Rate matching allows for HARQ transmissions with Chase combining or incremental redundancy.

The present disclosure also provides a method of and apparatus for bit-mapping and construction of rate-compatible polar codes on channels composed of constituent channels or multi-channels as communication systems with bit-interleaved code modulations and higher order modulation.

A method and an apparatus of the present disclosure provide a low-complexity rate-compatible family of polar codes, which do not require an exhaustive search at each block length, which makes polar coding practical in wireless systems and memory systems. Progressive puncturing guarantees a nested family of rate-compatible codes, and provides a systematic way for using polar codes in incremental redundancy or Chase combining systems.

The present disclosure reduces storage requirements, because only one sequence of indices of a length corresponding to a base code, which is shorter than the length of the corresponding final polar code, is stored at the receiver and the transmitter. This sequence is applicable to generating polar codes of any predetermined length with discrete increments, and at any desired rate.

FIG. 1 is a flowchart of a method of generating a progressive puncturing pattern for a base polar code from which a longer polar code is derived according to an embodiment of the present disclosure.

Referring to FIG. 1, a base polar code of length $2^n$ is obtained in step 101. The base polar code may be obtained by Kronecker products of a base matrix a predetermined number of times. For example, a base polar code of bit length 32 is obtained by 5 polarization steps of a 2×2 polarization matrix.

A pattern determines the sequence of bits (or group of bits) to puncture, where the puncturing pattern to puncture m+1 bits constitutes the pattern to puncture m bits, i.e. the sequence of m+1 bits has the sequence of m bits as its first m elements, which makes it suitable for deployment with HARQ protocols.

The progressive puncturing method operates on a base polar code of length $N=2^n$, and polar code rate (or mother polar code rate) k/N, and can generate a rate-compatible family of polar codes whose rates belong to the rate increments, $k/2^n$, $k/(2^n-1)$, $k/(2^n-2)$, to $k/(k+1)$. The polar code whose rate is $k/(2^n-m+1)$ can be obtained from the polar code whose rate is $k/(2^n-m)$ by transmitting the $m^{th}$ punctured bit (or corresponding group of bits described below).

In step 103, m bits to be punctured are determined one bit at a time, where a first bit index to be punctured is found by testing a design criterion $2^n$ times for a base polar code of length $2^n$. A determined bit is labeled as punctured. Then, a second bit to be punctured is found by testing the design criterion $2^n-1$ times, the index that results in the best design metric is selected as the bit to be punctured, and so on, for subsequent bits. To puncture m bits from a base code of length $2^n$, the design criterion is tested $\Sigma_{i=0}^{m-1}(2^n-i)=(m/2)*(2^{n+1}-m+1)$ times.

To find the whole puncturing sequence up to the length of the base code, the design criterion is tested $\Sigma_{i=0}^{2^n-2}(2^n-i)=(2^{2n}+2^n)/2-1$ times. In contrast, other methods require $$\sum_{i=1}^{2^n-1}\binom{2^n}{i}=2^{2^n}-2$$

pattern searches and tests of a design criterion, where finding a polar code of rate $k/(2^n-m)$ requires searching Choose($2^n$, m) possible patterns to puncture m bits out of $2^n$ bits, and where this search is repeated for each m, $m<2^n$. Moreover, the search procedure of prior art does not guarantee that the puncturing sequences are nested and hence may not be suitable for HARQ transmissions. For example, for a base polar code of length 32, 4,294,967,294 searches and tests of the design criterion are required, whereas in accordance with an embodiment of the present disclosure only 527 searches are required.

Figure 3:
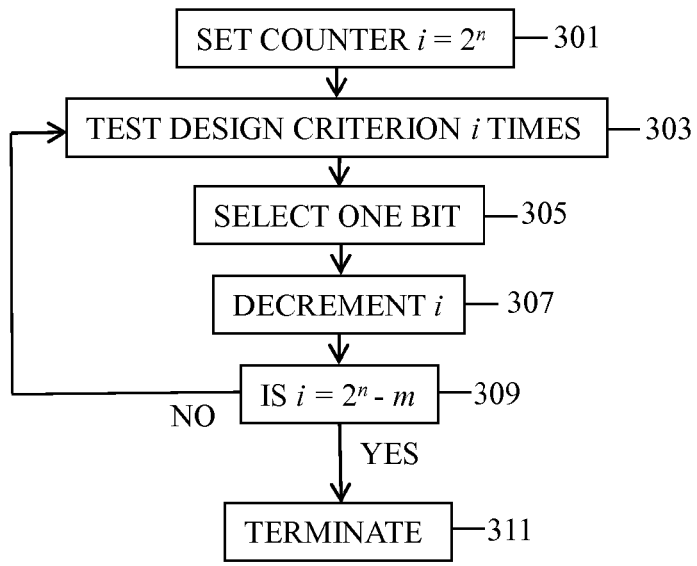
FIG. 3 is a flowchart of a method of determining m bits to puncture according to an embodiment of the present disclosure.
Figure 4:
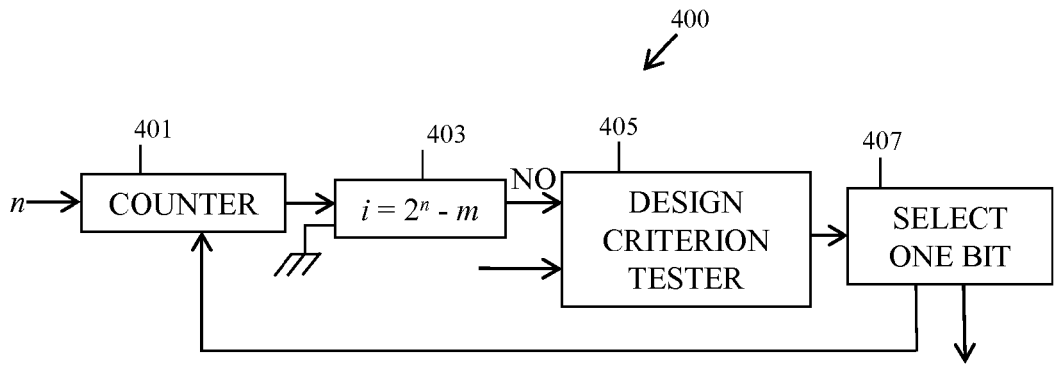
FIG. 4 is a block diagram of an apparatus for determining m bits to puncture according to an embodiment of the present disclosure.

Step 103 may also be implemented as illustrated in FIGS. 3 and 4 as described below.

Figure 2:
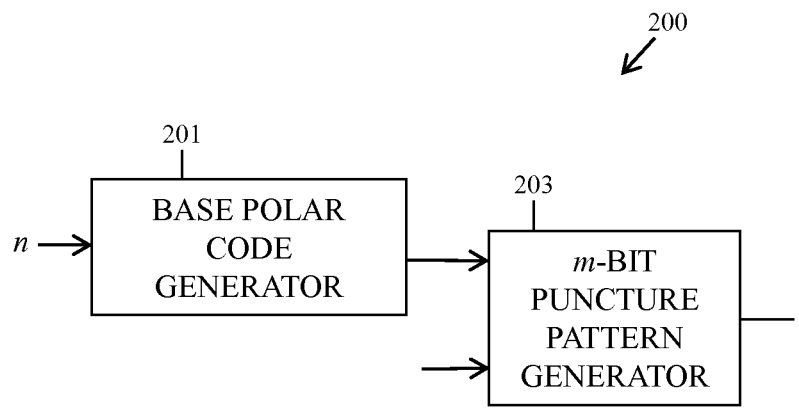
FIG. 2 is a block diagram of an apparatus for generating a progressive puncturing pattern for a base polar code according to an embodiment of the present disclosure.

FIG. 2 is a block diagram of an apparatus 200 for generating a progressive puncturing pattern for a base polar code according to an embodiment of the present disclosure.

Referring to FIG. 2, the apparatus 200 includes a base polar code generator 201 and an m-bit puncture pattern generator 203.

The base polar code generator 201 includes an input for receiving an integer n, generates a base polar code of length $2^n$, and includes an output that outputs the generated base polar code.

The base polar code is generated by n Kronecker products of a base matrix (e.g. a 2×2 polarization matrix) to generate a base polar code of length $2^n$, if a 2×2 polarization matrix is used.

The m-bit puncture pattern generator 203 has a first input for receiving the generated base polar code, a second input for receiving a design criterion, and an output that outputs the m-bit punctured base polar code, where the m bits to be punctured are determined one bit at a time, where a first bit index to be punctured is found by testing a design criterion $2^n$ times for a base polar code of length $2^n$. A determined bit is labeled as punctured. Then, a second bit to be punctured is found by testing the design criterion $2^n-1$ times on the non-punctured bits and the index that results in the best design metric is selected as the bit to be punctured, and so on for subsequent bits. To find the puncturing sequence for any $m<2^n$ bits up to the length of the code for a base code of length $2^n$, the design criterion is tested $\sum_{i=0}^{2^n-2}(2^n-i)= (2^{2n}+2^n)/2-1$ times.

FIG. 3 is a flowchart of a method of determining the sequence of $m<2^n$ bits to puncture according to an embodiment of the present disclosure.

Referring to FIG. 3, a counter i is set equal to $2^n$ in step 301.

In step 303, a design criterion is tested i times.

In step 305, the bit that satisfies the design criterion is selected to be punctured In step 307, i is decremented.

In step 309, it is determined if $i=2^n-m$. If $i\neq 2^n-m$, then the method returns to step 303. Otherwise, the method of determining the sequence of m bits to puncture is terminated in step 311.

The criterion to select the progressive puncturing pattern may be that the punctured polar code has a minimum aggregate information bit-error probability, defined by a sum of estimated error probabilities of all of the bit-channels of the information set of the polar code. The information bit-error probability may be estimated using a Gaussian approximation, a Monte-Carlo simulation, or quantization of the polarized channel through channel upgrading and degrading operations, where the channels on which the punctured bits are transmitted are modeled as binary erasure channels or channels with infinite noise variance.

In accordance with an embodiment of the present disclosure, the criterion to select the progressive puncturing pattern may be that the polarized bit-channel with the highest error probability corresponds to a punctured polar code bit. This uses the fact that puncturing m output polar code bits will result in setting m polarized bit-channels to have zero capacity. The input bit-channel with high error probability is often a bit-channel that does not carry information but is rather set (or frozen) to a predetermined value such as 0, and no information is lost by puncturing a polar code bit that corresponds to a frozen bit-channel.

Furthermore, the test criterion may be any metric on the base polar code that can be used to determine the polar code performance, with the constraint that the (m+1)th bit to be punctured is found by testing the metric for the $2^n-m$ candidate bits while fixing the previously m punctured bits. Such criteria may include a matrix polarization exponent, an error exponent of the resultant polar code, or a polar code minimum distance.

FIG. 4 is a block diagram of an apparatus 400 for determining the sequence of m bits to puncture according to an embodiment of the present disclosure.

Referring to FIG. 4, the apparatus 400 includes a counter 401, a comparator 403, a design-criterion tester 405, and a bit selector 407.

The counter 401 has a first input for receiving a value $2^n$ for initializing the value of the counter 401, a second input for receiving a signal to decrement the counter 401, and an output that outputs the current value of the counter 401. The value $2^n$ is the length of the base polar code to be punctured.

The comparator 403 has a first input connected to the output of the counter 401 for receiving the current value of the counter, a second input connected to a reference value depending on m (e.g. a ground potential or reference value), and an output that outputs the result of comparing the current value of the counter 401 to the reference value (i.e., a determination of whether or not the current value of the counter equals the reference value). If the current value of the counter 401 is not equal to the reference value, then the apparatus 400 operates; otherwise, the apparatus 400 stops operating.

The design-criterion tester 405 has a first input connected to the output of the comparator 403, a second input for receiving a design criterion, a first output that delivers the test results to the bit-selector 407, and a second output connected to the second input of the counter 401 for decrementing the counter 401 after each puncture bit is determined.

The bit-selector 407 selects one bit to puncture by comparing the test results received at its input and outputs a determination of a punctured bit.

The criterion to select the progressive puncturing pattern may be that the punctured polar code has a minimum aggregate information bit-error probability, defined by a sum of estimated error probabilities of all of the bit-channels of the information set of the polar code. The information bit-error probability may be estimated using a Gaussian approximation, a Monte-Carlo simulation, or quantization of the polarized channel through channel upgrading and degrading operations, where the channels on which the punctured bits are transmitted are modeled as binary erasure channels or channels with infinite noise variance.

In accordance with an embodiment of the present disclosure, the criterion to select the progressive puncturing pattern may be that the polarized bit-channel with the highest error probability corresponds to a punctured polar code bit. Again, this uses the fact that puncturing m output polar code bits will result in setting m polarized bit-channels to have zero capacity. The input bit-channel with high error probability is often a bit-channel does not carry information but is rather set (or frozen) to a predetermined value such as 0, and no information is lost by puncturing a polar code bit that corresponds to a frozen bit-channel.

Furthermore, the test criterion may be any metric on the base polar code that can be used to determine the polar code performance, with the constraint that the (m+1)th bit to be punctured is found by testing the metric for the $2^n-m$ candidate bits while fixing the previously m punctured bits. Such criteria include the matrix polarization exponent, or error exponent of the resultant polar code, or polar code minimum distance.

Figure 5:
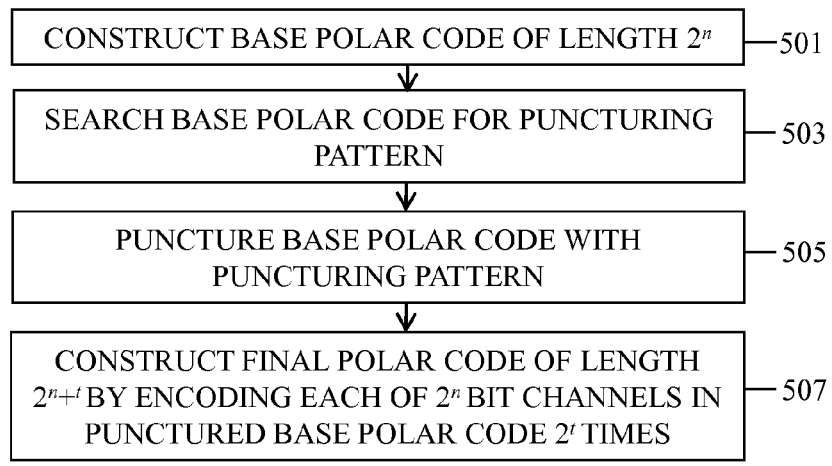
FIG. 5 is a flowchart of a method of two-stage polarization according to an embodiment of the present disclosure.

FIG. 5 is a flowchart of a method of two-stage polarization according to an embodiment of the present disclosure, wherein the base polar code is polarized to a predetermined polar code length and a regular puncturing pattern of the longer final polar code is derived from the progressive puncturing pattern of the shorter base polar code. While the present disclosure significantly reduces the complexity of progressive puncturing, it takes time to repeat this procedure for every possible length of the final polar code. Thus, the present disclosure avoids repeating the search for the best puncturing pattern for each final polar code length by only doing it once on a base polar code having a shorter length than the final polar code. This results in a significant saving in complexity, as progressive puncturing is only done on the base code, and will be used for puncturing at any other polar code of length $2^{n+t}$. For example, consider a single desired length $Q=2^{n+t}$, then progressive puncturing on the based code with two step polarization requires only $(2^{2n}+2^n)/2-1$ searches on the base code, which is much less than $(2^{(2n+2t)}+2^{(n+t)})/2-1$ searches required if progressive puncturing was done on the longer polar code and even much less than $2^{2^{(n+t)}}-1$ searches required by exhaustive search on the longer polar code of length $2^{n+t}$. The present disclosure also avoids storing a longer puncturing sequences for each final polar code length at the transmitter and the receiver.

Referring to FIG. 5, a short base polar code of length $2^n$ is constructed by polarizing a polarization matrix a first (e.g. small) number of times in a first encoding stage in step 501.

In step 503, the base polar code is searched for a puncturing pattern. The present disclosure results in a favorable regular puncturing pattern in a final polar code, which is longer than the base polar code.

In step 505, the base polar code is punctured in accordance with the searched puncturing code.

In step 507, a final polar code of length $2^{n+t}$ is constructed based on encoding method $B_{2^{n+t}}(F_2^{\otimes n} \times F_2^{\otimes t})$, where the first encoding stage constructed the base polar code of length $2^n$ in step 301 described above and the second encoding stage polarizes each of the $2^n$ bit channels $2^t$ times to construct the final polar code, which is longer than the base polar code, and $B_{2^{n+t}}$ is a reordering matrix according to a bit-reversal permutation.

Each punctured bit in the shorter base polar code corresponds to a group of $2^t$ punctured bits in the longer final polar code, where the puncturing pattern in the base polar code is applied to each consecutive $2^t$ output bits in the final polar code, resulting in a regular puncturing pattern. For example, a base polar code having length 32 is obtained by 5 polarization steps of a 2×2 polarization matrix and is labeled as $B_{2^5}(F_2^{\otimes 5})$, with corresponding generator matrix $G^{\otimes 5}$ and bit reversal mapping $B_{2^5}$. The encoding method for the longer final polar code is $B_{2^{12}}(F_2^{\otimes 5} \times F_2^{\otimes 7})$, where the first encoding step constructs a polar code of length $2^5$ and the last encoding step further polarizes each bit channel $2^7$ times. The puncturing pattern is applied on the consecutive sets of $2^5$ bits to form a regular puncturing pattern on the output bits of the longer final polar code.

In accordance with an embodiment of the present disclosure, a longer final polar code of length $2^{n+t}$ is constructed from a base polar code of length $2^n$ based on two-step polarization and encoding method $B_{2^{n+t}}(F_2^{\otimes t} \times F_2^{\otimes n})$, where the first encoding stage consists of $2^n$ polar encoders each for codes of length $2^t$, and the second encoding stage consists of $2^t$ encoders each for codes of length $2^n$, with the input to the $i^{th}$ encoder at the second encoding stage constitutes of the $i^{th}$ output bit-channels from the $2^t$ encoders in the first encoding stage. The second encoding stage polarizes each of the $2^t$ bit channels $2^n$ times. Each punctured bit in the base polar code corresponds to a group of $2^t$ punctured bits in the longer final polar code, where the puncturing pattern is repeated $2^t$ times, once for each encoder at the second stage. The base puncturing pattern is applied to the output of the second encoding stage such that each punctured bit in the base code corresponds to $2^t$ punctured output bits in the longer final polar code, which are polarized together by an encoder in the first stage. For example, a short base polar code has length 32 and is obtained by 5 polarization steps of a 2×2 polarization matrix, labeled as $B_{2^5}(F_2^{\otimes 5})$ with corresponding generator matrix $G^{\otimes 5}$ and bit reversal mapping $B_{2^5}$. In this example, the encoding method for the longer final polar code is $B_{2^{12}}(F_2^{\otimes 7} \times F_2^{\otimes 5})$, where the first encoding step constructs a polar code of length $2^7$ and the last encoding step further polarizes each bit channel $2^5$ times. Each consecutive $2^5$ output bits represent a component polar code and are punctured according to the puncturing pattern of the base polar code of length $2^5$ to result in a regular puncturing pattern on the longer polar code.

In accordance with an embodiment of the present disclosure, the methods for two-stage encoding and derivation of the puncturing pattern on the longer final polar code from that of the shorter base polar code can be applied on any puncturing pattern selected for the short code, which is not necessarily obtained by progressive puncturing.

Figure 6:
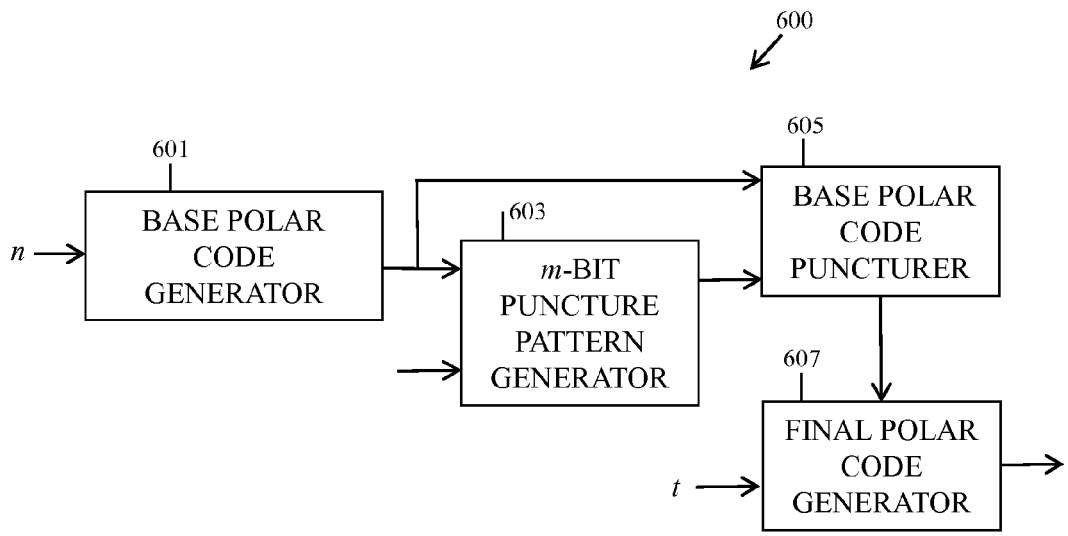
FIG. 6 is a block diagram of an apparatus for two-stage polarization according to an embodiment of the present disclosure.

FIG. 6 is a block diagram of an apparatus 600 for two-stage polarization according to an embodiment of the present disclosure, wherein a base polar code is polarized to a predetermined polar code length and a regular puncturing pattern of the longer final polar code is derived from the progressive puncturing pattern of the shorter base polar code.

Referring to FIG. 6, the apparatus 600 includes a base-polar-code generator 601, an m-bit puncture-pattern generator 603, a base-polar-code puncturer 605, and a final-polar-code generator 607.

The base-polar-code generator 601 includes an input for receiving an integer n and an output that outputs a base polar code of length $2^n$, where the base polar code is constructed by polarizing a polarization matrix n times.

The m-bit puncture-pattern generator 603 includes a first input connected to the output of the base-polar-code generator 601, a second input for receiving a design criterion, and an output that outputs an m-bit puncture pattern for the base polar code.

The base-polar-code puncturer 605 includes a first input connected to the output of the base-polar-code generator 601 for receiving the base polar code, a second input connected to the output of the m-bit puncture pattern generator 603 for receiving the m-bit puncture pattern, and an output that outputs the base polar code punctured in accordance with the m-bit puncture pattern.

The final-polar-code generator 607 includes a first input connected to the output of the base-polar-code puncture, a second input for receiving a value t, and an output at that outputs the final polar code. The final polar code is of length $2^{n+t}$ and is constructed based on encoding method $B_{2^{n+t}}(F_2^{\otimes n} \times F_2^{\otimes t})$, where each of the $2^n$ bit channels of the base polar code is polarized $2^t$ times.

Figure 7:
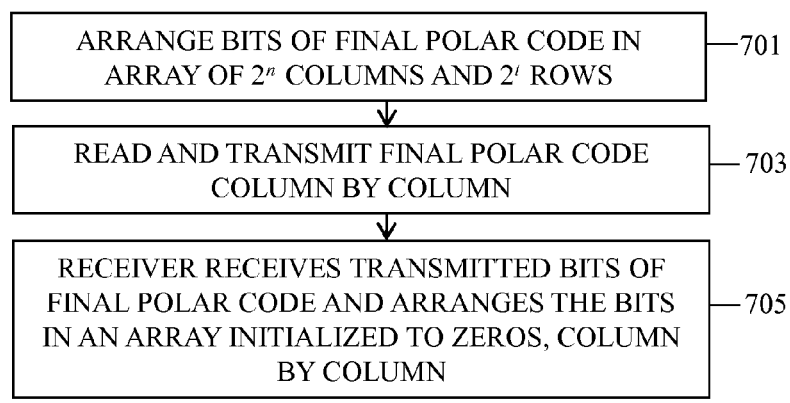
FIG. 7 is a flowchart of a method of rate-matching, channel interleaving, and transmission bit selection according to HARQ according to an embodiment of the present disclosure.

FIG. 7 is a flowchart of a method of rate-matching, channel interleaving, and transmission bit selection according to HARQ according to an embodiment of the present disclosure, where the progressive puncturing pattern constructed using the base polar code in step 301 of FIG. 5 described above, and where final polar code bits are systematically punctured according to the progressive puncturing pattern constructed using the base polar code. This method allows for one step encoding of the final polar code to a predetermined length, e.g. $B_{2^{n+t}}(F_2^{\otimes n+t})$.

Referring to FIG. 7, in step 701, for a two-stage encoding method $B_{2^{n+t}}(F_2^{\otimes n+t})$, the the output bits of the longer final polar code are arranged in a rectangular array of $2^n$ columns and $2^t$ rows, where the writing arrangement in the array is row first (i.e., first $2^n$ bits are written in the first row from left to right, then the second row and so on). The progressive puncturing sequence of length $2^n$ is found for the short code. The columns of the array are permuted in reverse order of the progressive puncturing sequence, i.e. if the progressive puncturing sequence is $\{i_1, i_2, \ldots, i_{2^n}\}$, then the permutation of the columns is performed such that the $i_1$ th column in the non-permuted array becomes the last column in the permuted array, and the $i_{2^n}$ th column in the non-permuted array becomes the first column in the permuted array.

In step 703, the output polar code to be transmitted on the channel is read and transmitted column by column, which results in an interleaved channel, where K and $Q=2^{n+t}$ are the lengths of the information block and the desired mother polar code block. Thus, the transmission code rate after puncturing is K/L, where L is equal to Q minus the number of punctured bits. The rate-matching method selects the bits to be transmitted and discards the punctured bits (i.e., the punctured bits are not transmitted).

If L is a multiple of $2^t$, i.e., L=m·$2^t$, then only the first m columns are transmitted. The method allows for the selection of any rate, and the present disclosure is not limited to L being a multiple of $2^t$. This also allows for finer granularity in transmitted rates, even though the puncturing pattern is designed for a base polar code. The L bits are read column-wise, top to bottom, starting from the first column, where only a fraction of the last column is read if L is not a multiple of $2^t$. Thus, the transmitted bit with index (j−1)$2^t$+i is the $(i,j)^{th}$ element of the column-permuted array existing in the $i^{th}$ row and $j^{th}$ column. The method preserves the regular puncturing pattern on the longer final polar code with its two-stage encoding structures.

This method also allows for the case when the transmitted code length L is greater than the mother code length Q where the rate of the transmitted polar code is K/L and is lower than the rate of the mother polar code K/Q, by repeating the most important bits. If L>Q, then the $2^t \times 2^n$ array after column permutation is considered a circular array, and the $(Q+1)^{th}$ transmitted bit is the $(1,1)^{th}$ bit of the column-permuted array.

In step 705, a receiving node receives the transmitted bits of the final polar code and arranges the received bits (e.g., soft log-likelihoods from the channel) in an array initialized to zeros, column-by column, where the log-likelihoods for the punctured bits are initialized to zero.

In accordance with an embodiment of the present disclosure, there may be addition row interleaving to achieve better transmission diversity, which may be achieved with polynomial interleavers while preserving the polarization structure. In addition, another channel interleaver may be imposed on the total output. Furthermore, the size of an array may be changed to correspond to different two step encodings.

Figure 8:
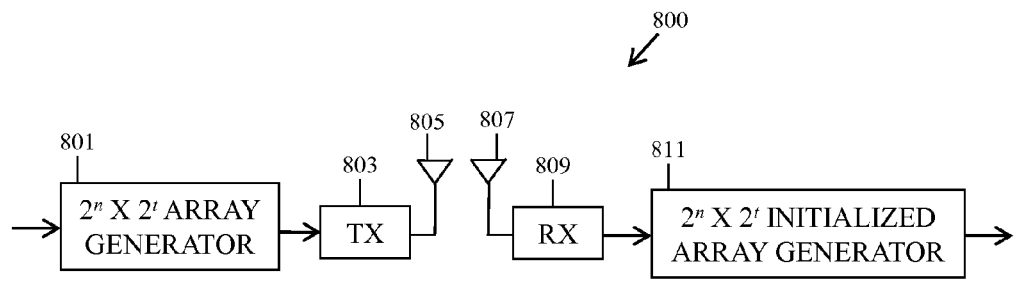
FIG. 8 is a block diagram of an apparatus for rate-matching, channel interleaving, and transmission bit selection according to HARQ according to an embodiment of the present disclosure.

FIG. 8 is a block diagram of an apparatus 800 for rate-matching, channel interleaving, and transmission bit selection according to HARQ according to an embodiment of the present disclosure.

Referring to FIG. 8, the apparatus 800 includes a $2^n \times 2^t$ array generator 801, a transmitter 803, a first antenna 805, a second antenna 807, a receiver 809, and a $2^n \times 2^t$ initialized-array generator 811.

The $2^n \times 2^t$ array generator 801 includes an input for receiving a final polar code of length Q=$2^{n+t}$ and an output for providing the bits of the final polar code to be transmitted, where the writing arrangement in the array is row first (i.e., first $2^n$ bits are written in the first row from left to right, then the second row and so on). The progressive puncturing sequence of length $2^n$ is found for the short code. The columns of the array are permuted in reverse order of the progressive puncturing sequence, i.e., if the progressive puncturing sequence is $\{i_1, i_2, \ldots i_{2^n}\}$, then the permutation of the columns is performed such that the $i_1$ th column in the non-permuted array becomes the last column in the permuted array, and the $i_{2^n}$ th column in the non-permuted array becomes the first column in the permuted array. The output polar code to be transmitted on the channel is read and transmitted column by column, which results in an interleaved channel, where K and Q are the lengths of the information block and the final mother polar code block. Thus, the transmission code rate after puncturing is K/L, where L is equal to Q minus the number of punctured bits.

The rate-matching method selects the bits to be transmitted and discards the punctured bits (i.e., the punctured bits are not transmitted). If L is a multiple of $2^t$, i.e., L=m·$2^t$, then only the first m columns are transmitted. Any rate may be selected, and the present disclosure is not limited to L being a multiple of $2^t$. This allows for finer granularity in transmitted rates, even though the puncturing pattern is designed for a base polar code. The L bits are read column-wise, top to bottom, starting from the first column, where only a fraction of the last column is read if L is not a multiple of $2^t$. Thus, the transmitted bit with index (j−1)$2^t$+i is the $(i,j)^{th}$ element of the column-permuted array existing in the $i^{th}$ row and $j^{th}$ column. This preserves the regular puncturing pattern on the longer final polar code with its two-stage encoding structures.

This method also allows for the case when the transmitted code length L is greater than the mother code length Q where the rate of the transmitted polar code is K/L and is lower than the rate of the mother polar code K/Q, by repeating the most important bits. If L>Q, then the $2^t \times 2^n$ array after column permutation is considered a circular array, and the $(Q+1)^{th}$ transmitted bit is the $(1,1)^{th}$ bit of the column-permuted array.

The transmitter 803 includes an input connected to the output of the $2^n \times 2^t$ array generator 801 and an output.

The first antenna 805 is connected to the output of the transmitter for broadcasting the bits of the final polar code to be transmitted.

The second antenna 807 receives the bits of the final polar code that were broadcast by the first antenna 805.

The receiver 809 includes an input connected to the second antenna 807 and an output at which appears the received bits of the final polar code. The receiver 807 receives the transmitted bits of the final polar code and arranges the received bits (e.g., soft log-likelihoods from the channel) in an array initialized to zeros, column-by column, where the log-likelihoods for the punctured bits are initialized to zero.

The $2^n \times 2^t$ initialized-array generator 811 includes an input connected to the output of the receiver 809 for receiving bits of the final polar code.

Figure 9:
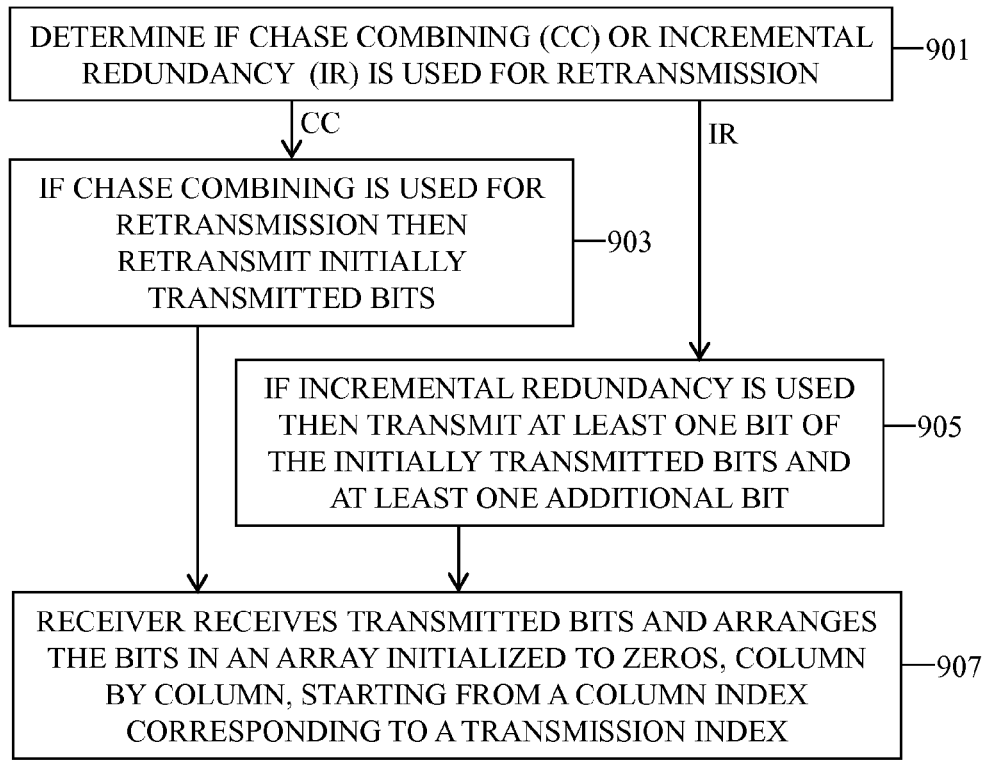
FIG. 9 is a flowchart of a method of bit-selection for retransmission and HARQ combining according to an embodiment of the present disclosure.

FIG. 9 is a flowchart of a method of bit-selection for retransmissions and HARQ combining, which allows for Chase combining or incremental redundancy, according to an embodiment of the present disclosure.

Referring to FIG. 9, in step 901, it is determined that either Chase combining or incremental redundancy is used for a retransmission.

If Chase combining is used for a retransmission, then the bits initially transmitted are retransmitted in step 903.

However, if incremental redundancy is used for retransmission, then at least one of the bits is initially transmitted and at least one additional bit is transmitted in step 905.

Each transmission may be assigned a transmission index, where there can be T different transmission indices. In this case, a transmission with a transmission index will start reading transmitted bits columns-by-column. Transmissions with different transmission indices will start reading the output bits from different column indices. The transmission indices may be evenly distributed among the columns of the array. The transmission indices $\{1, 2, \ldots, T\}$ may correspond to column indices $\{1, 1+2^n/T, \ldots, 1+(T-1)2^n/T\}$. If the transmission rate is K/L, the number of bits to read and transmit column-wise starting from the top of the column with index characterized by the transmission index is L. If it is required to transmit at a coding rate K/L lower than K/Q, where L>Q, then L bits are read column-wise starting from the column with the index characterized by the transmission index L. If the end of an array is read (e.g., bottom bit in right-most column) before reading all L bits, then the rate-matcher will continue reading in a cyclic column-wise manner, by reading the rest of the output bits from the first column (e.g. top bit in first column) of the column-permuted array. If $L>2^n/T\cdot 2^t$ then the transmissions with different transmission indices will have overlapping bits, otherwise the transmissions may have mutually exclusive bits.

In step 907, a receiving node arranges the received bits (e.g., soft log-likelihoods from the channel) in an array initialized to zeros, column-by column starting from the column index corresponding to the transmission index, where the log-likelihoods for the punctured bits will be initialized to zero. In case of repetition, the array is treated as a circular array and received soft bits overlapping in the same array index will be combined together. The receiving node will rearrange the columns of the received array according to the progressive puncturing order. If the progressive puncturing sequence is $\{i_1, i_2, \ldots, i_{2^n}\}$, such that the $i_{2^n}$ th column in the resultant array is the first column in the received array.

In accordance with an embodiment of the present disclosure, the column indices corresponding to transmission indices are not required to be evenly distributed across the whole array according to an optimization procedure. In addition, the column index corresponding to the first transmission is not required to be the first column according to an optimization procedure.

Figure 10:
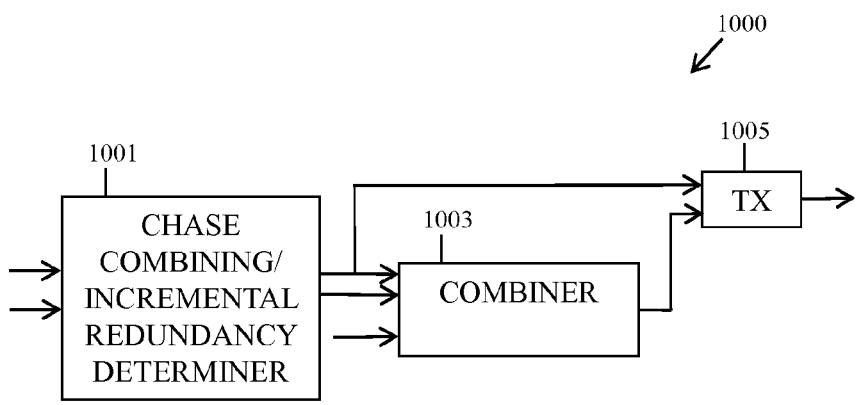
FIG. 10 is a block diagram of an apparatus for bit-selection for retransmission and HARQ combining according to an embodiment of the present disclosure.

FIG. 10 is a block diagram of an apparatus 1000 for bit-selection for retransmission and HARQ combining according to an embodiment of the present disclosure.

Referring to FIG. 10, the apparatus 1000 includes a Chase combining/incremental redundancy determiner 1001, a combiner 1003, and a transmitter 1005.

The Chase combining/incremental redundancy determiner 1001 includes a first input for selecting between Chase combining and incremental redundancy, a second input for receiving the most recent transmission of the final polar code, a first output that outputs the most recent transmission of the final polar code, and a second output for enabling incremental redundancy.

The combiner 1003 includes a first input connected to the first output of the Chase combining/incremental redundancy determiner 1001, a second input connected to the second output of the Chase combining/incremental redundancy determiner 1001, a third input for receiving additional bits to be transmitted, and an output that outputs some of the bits of the most recent transmission of the final polar code combined with the additional bits to be transmitted.

The transmitter 1005 includes a first input connected to the first output of the Chase combining/incremental redundancy determiner 1001, a second input connected to the output of the combiner 1003, and an output for either transmitting the most recent transmission of the final polar code or transmitting some or none of the bits of the most recent transmission of the final polar code together with the additional bits to be transmitted from the final polar code.

Each transmission may be assigned a transmission index, where there can be T different transmission indices. For Chase combining, all transmissions will have the same index. For Incremental redundancy, different transmissions can have different transmission indices. In this case, a transmission with a transmission index will start reading transmitted bits columns-by-column. Transmissions with different transmission indices will start reading the output bits from different column indices. The transmission indices may be evenly distributed among the columns of the array. The transmission indices $\{1,2,\ldots,T\}$ may correspond to column indices $\{1, 1+2^n/T, \ldots, 1+(T-1)2^n/T\}$. If the transmission rate is K/L, the number of bits to read and transmit column-wise starting from the top of the column with index characterized by the transmission index is L. If it is required to transmit at a coding rate K/L lower than K/Q, where L>Q, then L bits are read column-wise starting from the column with the index characterized by the transmission index L. If the end of an array is read (e.g., bottom bit in right-most column) before reading all L bits, then the rate-matcher will continue reading in a cyclic column-wise manner, by reading the rest of the output bits from the first column (e.g., top bit in first column). If $L>2^n/T\cdot 2^t$ then the transmissions with different transmission indices will have overlapping bits, otherwise the transmissions will have mutually exclusive bits.

Figure 11:
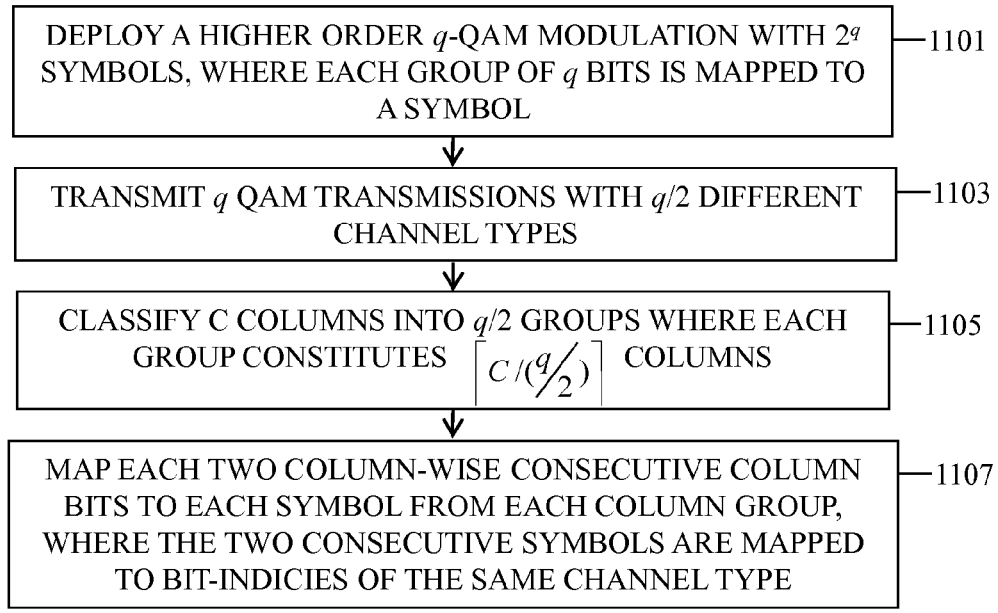
FIG. 11 is a flowchart of a method of integrating bit-mapping to higher order modulation channels with systematic puncturing while maximizing polarization on bit-interleaved coded modulation channel according to an embodiment of the present disclosure.

FIG. 11 is a flowchart of a method of integrating bit-mapping to higher order modulation channels with systematic puncturing while maximizing polarization on bit-interleaved coded modulation channel according to an embodiment of the present disclosure. Compound polar coding may be used in the case of bit-interleaved coded modulation, higher order modulation transmission, or transmissions over multi-channels.

Referring to FIG. 11, in step 1101, a higher order q Quadrature Amplitude Modulation (q-QAM) with $2^q$ symbols is used, where each group of q bits is mapped onto one symbol. According to the bit-to-symbol mapping, each 2 bits can have the same channel reliability. If L bits are to be transmitted, $C=\lceil L/2^q \rceil$ is the number of columns from which bits are to be read and transmitted in total, starting from the column with the index corresponding to the transmission index.

In step 1103, q-QAM transmissions are made with q/2 different channel types.

In step 1105, the C columns are classified into q/2 groups, where each group constitutes $\lceil C/(q/2) \rceil$ consecutive columns, where "⌈ ⌉" indicates a ceiling function.

In step 1107, each two column-wise consecutive column bits are mapped to each symbol from each column group, where the two consecutive symbols are mapped to the bit-indices with the same channel type. This structure allows for all channel types, as well as a punctured channel, to be encoded in each constituent polar code of short length corresponding to one row, which maintains the polarization and resulting in good performance.

In accordance with an embodiment of the present disclosure, the mapping of q/2 different channel types to the different q/2 column groups can be done in q/2! ways. The different mappings may be tested and the best one at a predetermined coding rate and transmission index (corresponding to a unique set of punctured bits) may be chosen.

In accordance with an embodiment of the present disclosure, the above mapping may be switched from one transmission index to another, i.e., each of the T transmission indices may use a different bit-mapping for added channel diversity. According to this embodiment, each transmission can correspond to either a Chase combining or incremental redundancy transmission as described above.

In accordance with an embodiment of the present disclosure, all q bits may be transmitted consecutively after reading column-wise or after additional interleaving on the punctured code.

In accordance with an embodiment of the present disclosure, a rate-matching array may be replicated q/2 times for a multi-channel with q/2 channel types as q-QAM transmissions. In this case, the consecutive bits read from each replicated rate-matching array will be mapped to a different channel type.

Figure 12:
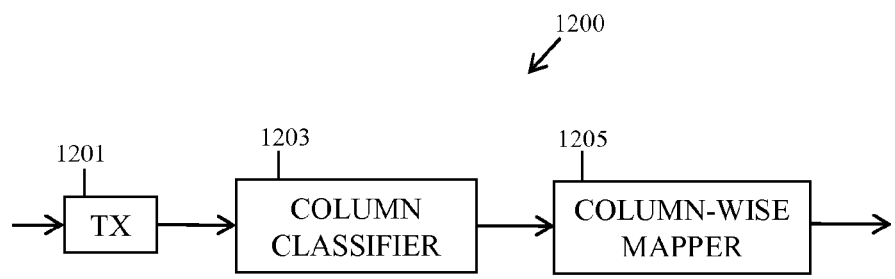
FIG. 12 is a block diagram of an apparatus for integrating bit-mapping to higher order modulation channels with systematic puncturing while maximizing polarization on bit-interleaved coded modulation channel according to an embodiment of the present disclosure.

FIG. 12 is a block diagram of an apparatus 1200 for integrating bit-mapping to higher order modulation channels with systematic puncturing while maximizing polarization on bit-interleaved coded modulation channel according to an embodiment of the present disclosure.

Referring to FIG. 12, the apparatus 1200 includes a transmitter 1201, a column classifier 1203, and a column-wise mapper 1205.

The transmitter 1201 includes an input for receiving a higher order q-QAM modulation with $2^q$ symbols is used, where each group of q bits is mapped onto one symbol, and each 2 bits have the same channel reliability, and an output for making q-QAM transmissions with q/2 different channel types. If L bits are to be transmitted, then $C=\lceil L/2^q \rceil$ is the number of columns from which bits are to be read and transmitted in total, starting from the column with the index corresponding to the transmission index, where "$\lceil \ \rceil$" indicates a ceiling function.

The column classifier 1203 includes an input connected to the output of the transmitter 1201 and an output that outputs the C columns classified into q/2 groups, where each group constitutes $\lceil C/(q/2) \rceil$ consecutive columns, where "$\lceil \ \rceil$" indicates a ceiling function.

The column-wise mapper 1205 includes an input connected to the output of the column classifier 1203, where the column-wise mapper 1205 maps each two column-wise consecutive column bits to each symbol from each column group, where the two consecutive symbols are mapped to the bit-indices with the same channel type. This structure allows for each bit-interleaved coded modulation channel type, as well as a punctured channel, to be encoded with a separate constituent polar code of shorter length $2^t$ corresponding to one column in the array, which maintains the polarization and resulting in good performance.

Figure 13:
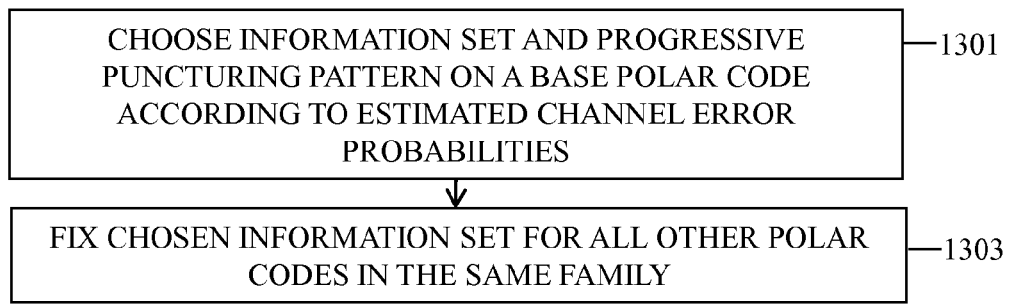
FIG. 13 is a flowchart of a method of selecting an information set according to an embodiment of the present disclosure.

FIG. 13 is a flowchart of a method of selecting an information set according to an embodiment of the present disclosure. A constructed family of codes is characterized by having the set of input indices carrying the same information bits across all codes with different rates in the same family with a predetermined code length.

Referring to FIG. 13, in step 1301, the information set and a progressive puncturing pattern on a base polar code are chosen according to estimated channel error probabilities, where the channel error probabilities can be estimated at various channel signal to noise ratios (SNRs). Choosing a low SNR results in a code with superior performance for the low rate codes in the family. Designing the progressive puncturing pattern based on a channel with high SNRs favors the codes in the family with high code rates. The SNR point for selection can be chosen as a median SNR, or target operating code rate. The information set must be chosen for each family with a predetermined code length. Given the puncturing pattern on the final polar code derived from the puncturing pattern of the base polar code, the set of information bit channels are found by estimating the bit-channel error probabilities of the code in the family with the highest code rate. The information bit-channels are then chosen to be those with the least error probability.

In step 1303, the information set is then fixed for all other polar codes in the same family.

In accordance with an embodiment of the present disclosure, if a polar code is to be designed to work across different channel types, then the bit-channel error performance of the predetermined polar code (e.g. the polar code with the highest code rate in a family of polar codes) can be estimated across all of the different channel types, and the supremum of the error probabilities for each bit-channel is used for information bit-selection.

In accordance with an embodiment of the present disclosure, an iterative procedure is devised to jointly find the information set and a progressive puncturing pattern for the base polar code, where the best information set is found after each puncturing step to be used to select the next punctured bit. After finding the puncturing pattern for the highest code rate in the family of polar codes, the information set is found based on that code. Then the progressive puncturing pattern is repeated while fixing the information set for that of the highest code rate. The process can be repeated until there is no change in the information set or the progressive puncturing.

In accordance with an embodiment of the present disclosure, the information set may be selected from the base polar code, such as with the iterative procedure described above, and used to derive the information set of the final polar code, where the final polar code is longer than the base polar code.

Figure 14:
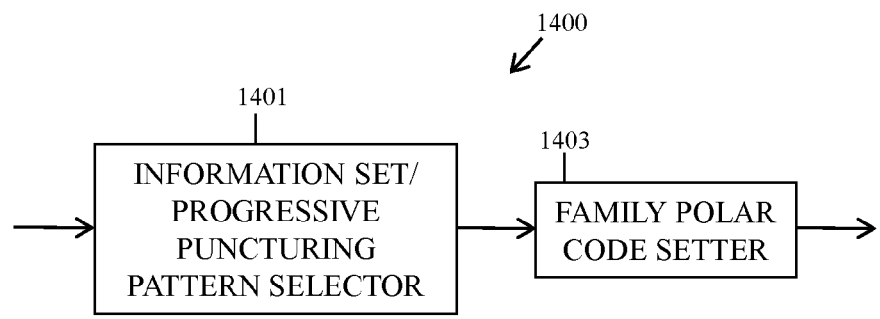
FIG. 14 is a block diagram of an apparatus for selecting an information set according to an embodiment of the present disclosure.

FIG. 14 is a block diagram of an apparatus 1400 for selecting an information set according to an embodiment of the present disclosure.

Referring to FIG. 14, the apparatus 1400 includes an information set/progressive puncturing pattern selector 1401 and a family polar code setter 1403.

The information set/progressive puncturing pattern selector 1401 has an input for selecting an information set and a progressive puncturing pattern on a base polar code according to estimated channel error probabilities, where the channel error probabilities can be estimated at various channel signal to noise ratios (SNRs). In addition, information set/progressive puncturing pattern selector 1401 has an output that outputs the selected information set and the progressive puncturing pattern.

The family polar code setter 1403 includes an input connected to the output of the information set/progressive puncturing pattern selector 1401 and an output that outputs the information set that is fixed for all other polar codes in the same family.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A method of constructing hybrid automatic repeat request (HART) rate-compatible polar codes for wireless channels, the method comprising:
  constructing, in a base polar code generator, a base polar code of length $2^n$; and
  determining, in an m-bit puncture pattern generator, a sequence of $m<2^n$ bits to puncture in the base polar code by testing a predetermined criterion at most $(2^{2n}+2^n)/2-1$ times, where n and m are each an integer.

2. The method of claim 1, wherein determining the m bits to puncture in the base polar code by testing the predetermined criterion at most $(2^{2n}+2^n)/2-1$ times comprises:
  setting, in the terminal, a counter i equal to $2^n$;
  testing the predetermined design criterion i times;
  selecting one bit to puncture;
  decrementing i;

if i is not equal to $2^n-m$, returning to the step of testing the predetermined design criterion i times; and if i is equal to $2^n-m$, terminating the method.

3. The method of claim 1, further comprising:

searching, in the terminal, the base polar code for a puncturing sequence;

puncturing the base polar code according to the puncturing sequence; and constructing a final polar code of length $2^{n+t}$ bits by encoding each of the $2^n$ bits in the punctured base polar code $2^t$ times.

4. The method of claim 3, further comprising:

storing, in the terminal, the bits of the final polar code in an array of $2^n$ columns and $2^t$ rows;

arrange the columns of the array according to a known puncturing sequence;

reading the bits of final polar code column by column;

transmitting, by the terminal, the read bits of the final polar code;

receiving, by a receiver, the transmitted bits of the final polar code;

initializing an array to zeros by the receiver; and storing the received bits of the final polar code in the initialized array, column by column;

combine bits that are received at the same array index; and arrange the columns of the received array according to a known puncturing sequence.

5. The method of claim 1, further comprising:

determining, in the terminal, if Chase combining or incremental redundancy is used for retransmission;

if Chase combining is used for retransmission, retransmitting, by the terminal, the bits of the final polar code that were initially transmitted;

if incremental redundancy is used for retransmission, transmitting, by the terminal, at least one additional bit;

receiving, by a receiver, the retransmitted bits; initializing an array to zeros by the receiver;

storing the retransmitted bits in the initialized array, column by column, starting at a column index corresponding to a transmission index;

combining bits that are received at the same index in the array within the same transmission or across different transmissions; and arrange the columns of the received array according to a known puncturing sequence.

6. The method of claim 1, further comprising:

using, by the terminal, a higher order q Quadrature Amplitude Modulation (q-QAM) with $2^q$ symbols, where each group of q bits is mapped to a symbol;

transmitting, by the terminal, q QAM transmissions with q/2 different channel types;

classifying, by the terminal, C columns of transmitted bits into q/2 groups, where each group include $$\lceil C/(q/2) \rceil$$

columns; and mapping, by the terminal, each two column-wise consecutive column bits to each symbol from each column group, where the two consecutive symbols are mapped to bit-indices of a same channel type.

7. The method of claim 1, further comprising:

selecting, by the terminal, an information set and a puncturing pattern of the base polar code according to estimated channel error probabilities; and setting the information set for each polar code in a family of polar codes.

8. An apparatus for constructing hybrid automatic repeat request (HARQ) rate-compatible polar codes for wireless channels, the apparatus comprising:

a base polar code generator including an input for receiving a value n, and an output; and an m-bit puncture pattern generator including a first input connected to the output of the base polar code generator, a second input for receiving a design criterion, and an output, where n and m are each an integer.

9. The apparatus of claim 1, further comprising:

a counter including a first input for receiving a value n, a second input for receiving a decrement signal, and an output;

a comparator including a first input connected to the output of the counter, a second input connected to a reference value, and an output;

a design criterion tester including a first input connected to the output of the comparator, a second input for receiving a design criterion, a first output connected to the second input of the counter, and a second output.

10. The apparatus of claim 1 further comprising:

a base polar code puncturer including a first input connected to the output of the base polar code generator, a second input connected to the output of the m-bit puncture pattern generator, and an output; and a final polar code generator including a first input connected to or reading the output of the base polar code puncturer, a second input for receiving a value t, and an output.

11. The apparatus of claim 10, further comprising:

a $2^n \times 2^t$ array generator including an input connected to the output of the final polar code generator, and an output;

a transmitter including an input connected to the output of the $2^n \times 2^t$ array generator, and an output connected to a first antenna;

a receiver including an input connected to a second antenna, and an output; and a $2^n \times 2^t$ initialised array generator including an input connected to the output of the receiver, and an output.

12. The apparatus of claim 10, further comprising:

a Chase combining/incremental redundancy determiner including a first input for selecting between Chase combining and incremental redundancy, a second input for receiving an initial transmission, a first output that outputs the initial transmission, and a second output that outputs an enable signal;

a combining including a first input connected to the first output of the Chase combining/incremental redundancy determiner, a second input connected to the second output of the Chase combining/incremental redundancy determiner, a third input for receiving at least one additional bit, and an output; and a transmitter including a first input connected to the first output of the Chase combining/incremental redundancy determiner, a second input connected to the output of the combiner, and an output.

13. The apparatus of claim 11, wherein the transmitter uses a higher order q Quadrature Amplitude Modulation with $2^q$ symbols, where each group of q bits is mapped to a symbol, and transmits q QAM transmissions with q/2 different channel types, and further comprising:

a column classifier including an input for receiving the q QAM transmissions, and an output that outputs C columns classified into q/2 groups, where each group constitutes ceiling(C/(q/2)) columns; and a column-wise mapper including an input connected to the output of the column classifier, and an output where each two column-wise consecutive column bits are mapped to each symbol from each column group, where the two consecutive symbols are mapped to bit-indices of a same channel type.

14. The apparatus of claim 8, further comprising:

an information set/puncturing pattern selector including an input for selecting an information set and a puncturing pattern, and having an output; and a family polar code setter including an input connected to the output of the information set/puncturing pattern selector, and an output that outputs the selected information set and the puncturing pattern for all polar codes in a family.

15. A chipset for constructing hybrid automatic repeat request (HARQ) rate-compatible polar codes for wireless channels, the chipset configured to:

construct, in a base polar code generator, a base polar code of length $2^n$; and determine, in an m-bit puncture pattern generator, a sequence of m<$2^n$ bits to puncture in the base polar code by testing a predetermined criterion at most $(2^{2n}+2^n)/2-1$ times, where n and m are each an integer.

16. The chipset of claim 15, further configured to:

set a counter i equal to $2^n$;

test the predetermined design criterion i times;

select one bit to puncture;

decrement i;

if i is not equal to $2^n-m$, return to test the predetermined design criterion i times; and if i is not equal to $2^n-m$, terminate determining the m bits to puncture.

17. The chipset of claim 15, further configured to:

search the base polar code for a puncturing pattern;

puncture the base polar code according to the puncturing pattern; and construct a final polar code of length $2^{n+t}$ bits by encoding each of the $2^n$ bits in the punctured base polar code $2^t$ times.

18. The chipset of claim 17, further configured to:

store the bits of the final polar code in an array of $2^n$ columns and $2^t$ rows;

arrange the $2^n$ columns of the array according to a known puncturing sequence;

read the bits of final polar code column by column;

transmit the read bits of the final polar code;

receive the transmitted bits of the final polar code;

initialize an array to zeros;

store the received bits of the final polar code in the initialized array, column by column;

combine bits that are received at the same array index; and arrange the columns of the received array according to a known puncturing sequence.

19. The chipset of claim 15, further configured to:

determine if Chase combining or incremental redundancy is used for retransmission; if Chase combining is used for retransmission, retransmit the bits of the final polar code that were initially transmitted;

if incremental redundancy is used for retransmission, transmit at least one additional bit; receive the retransmitted bits; initialize an array to zeros;

store the retransmitted bits in the initialized array, column by column, starting at a column index corresponding to a transmission index;

combine bits that are received at the same index in the array within the same transmission or across different transmissions; and arrange the columns of the received array according to a known puncturing sequences.

20. The chipset of claim 15, further configured to:

select an information set and a puncturing pattern of the base polar code according to estimated channel error probabilities; and set the information set for each polar code in a family of polar codes.

* * * * *

UNITED STATES PATENT AND TRADEMARK OFFICE
CERTIFICATE OF CORRECTION

PATENT NO. : 9,742,440 B2
APPLICATION NO. : 14/836280
DATED : August 22, 2017
INVENTOR(S) : Mostafa El-Khamy et al.

It is certified that error appears in the above-identified patent and that said Letters Patent is hereby corrected as shown below:

In the Claims

In Column 16, Claim 1, Line 2, "request (HART) rate-compatible polar codes for wireless" should be -- request (HARQ) rate-compatible polar codes for wireless --

In Column 18, Claim 11, Line 2, "a 2"×2' array generator including an input connected to" should be -- a $2^n \times 2^t$ array generator including an input connected to --

In Column 18, Claim 11, Line 6, "the 2"×2' array generator, and an output connected to a" should be -- the $2^n \times 2^t$ array generator, and an output connected to a --

In Column 18, Claim 11, Line 10, "a 2"×2' initialised array generator including an input" should be -- a $2^n \times 2^t$ initialized array generator including an input --

In Column 20, Claim 19, Line 16, "known puncturing sequences." should be -- known puncturing sequence. --

Signed and Sealed this
Twenty-second Day of January, 2019

Andrei Iancu
*Director of the United States Patent and Trademark Office*